United States Patent [19]

Stone et al.

[11] Patent Number: 5,753,391
[45] Date of Patent: May 19, 1998

[54] METHOD OF FORMING A RESISTOR HAVING A SERPENTINE PATTERN THROUGH MULTIPLE USE OF AN ALIGNMENT KEYED MASK

[75] Inventors: Marshall D. Stone, San Jose; Martin E. Garnett, Los Gatos; Michael J. Mottola; Hiu F. Ip, both of San Jose, all of Calif.

[73] Assignee: Micrel, Incorporated, San Jose, Calif.

[21] Appl. No.: 535,000

[22] Filed: Sep. 27, 1995

[51] Int. Cl.⁶ .................................................. G03F 9/00
[52] U.S. Cl. .................. 430/22; 430/313; 430/316; 430/318; 29/847; 148/DIG. 102; 257/797; 437/228; 437/924
[58] Field of Search ........................... 430/22, 313, 316, 430/318; 437/228, 245, 246, 249, 924; 29/847; 148/DIG. 102; 257/797

[56] References Cited

U.S. PATENT DOCUMENTS

| | | | |
|---|---|---|---|
| 4,894,316 | 1/1990 | Hjulstrom | 430/316 |
| 5,496,777 | 3/1996 | Moriyama | 437/249 |

*Primary Examiner*—Christopher G. Young
*Attorney, Agent, or Firm*—Skjerven, Morrill, MacPherson, Franklin, & Friel; Brian D. Ogonowsky

[57] ABSTRACT

Each die containing a resistive element which is to be trimmed has associated therewith a plurality of alignment targets. A cut mask having a trim pattern and an alignment key formed thereon is employed in a masking and etching step to trim the resistive element to a desired resistance. The number of links cut in the resistive element, and thus the final resistance thereof, depends on the particular positioning of the cut mask with respect to the die as determined by which of the alignment targets is aligned with the alignment key. For instance, aligning the alignment key with a first alignment target would result in cutting one link in the resistive element so as to achieve a first resistance value, while re-aligning the cut mask such that the alignment key aligns with another of the alignment targets would result in cutting two links in the resistive element so as to achieve a second resistance value. Since the trim of resistive elements may be adjusted to any one of many possible resistance values by simply changing the alignment of the cut mask with respect to the die, the need to have a separate cut mask for each of the possible trimmed resistance values is eliminated, thereby reducing costs.

7 Claims, 4 Drawing Sheets

METHOD OF FORMING A RESISTOR HAVING A SERPENTINE PATTERN THROUGH MULTIPLE USE OF AN ALIGNMENT KEYED MASK

FIELD OF THE INVENTION

The present invention relates to trimming resistors or other components fabricated on a substrate.

BACKGROUND

Many integrated circuits (ICs) such as voltage regulators and analog to digital converters (ADCs) require precise resistance values for the resistors fabricated thereon in order to meet desired circuit specifications. However, due to process variations inherent during the fabrication of ICs, it is difficult to precisely control the resistances of on-chip resistive elements. For instance, in a typical wafer fabrication process, the final values of on-chip resistive elements may vary as much as 15–20% from their intended values. Thus, it is often necessary to trim such resistive elements after fabrication in order to obtain a desired resistance value.

One well known technique of trimming on-chip resistive elements utilizes a laser beam to alter the shape of the resistive elements. The laser is used to make cuts in the resistive elements along predetermined cut paths in order to change the area, and thus the resistance associated therewith, of the resistive elements. Although effective in precisely trimming a resistive element to a desired value, the aging and annealing effects resulting from such a laser trimming technique may degrade the performance of the resistive element's host circuit. The partially "zapped" material around the edge of the laser-ablated cut path will often have properties different from those of the undisturbed material further away from the laser-ablated regions. Further, the resistance of the partially zapped material will age at a different rate than will the remaining portions of the resistive element. As a result, the IC may drift out of specification after prolonged usage.

An alternative trimming technique employs fusible links to adjust the resistance of on-chip resistive elements to a desired resistance value. Each fusible link is controlled by a pair of trim pads located on the periphery of the chip, where application of a voltage between a pair of trim pads will blow the fusible link interposed therebetween. These trim pads, which must be sufficiently large to allow a probe to come into contact therewith, are typically approximately 0.004 square inches. Thus, although avoiding problems arising from laser ablation, fusible link techniques undesirably require silicon surface area to accommodate trim pads. In applications which require many fusible links, the periphery of the chip may become dominated by the trim pads, thereby undesirably increasing the size of the chip.

Some of these problems may be overcome using a metal-link cutting technique. FIG. 1 shows a conventional MOS resistive element 10 having an insulating layer (not shown) interposed between a continuous resistive layer 11 formed on an underlying substrate (not shown) and a metal layer 12 such that resistive layer 11 and metal layer 12 are electrically isolated from one another. Resistive layer 11 may be any suitable resistive material such as doped polysilicon. A plurality of contact pads 13–18 are formed within resistive layer 11 and extend through the insulating layer so as to contact metal layer 12 which, in turn, effectively short circuits resistive layer 11 between contact pads 13 and 18. Those portions of resistive layer 11 which are interposed between respective pairs of contact pads 13–18 are denoted portions $R_1$-$R_5$, respectively.

The resistance of element 10 may be adjusted to a desired level by selectively etching portions of metal layer 12 along cut paths 19–23. For instance, where it is desired for the total resistance of element 10 to equal that of portion $R_1$, metal layer 12 is masked and then etched, according to a predetermined cut pattern, such that metal layer 12 is etched and removed only along cut path 19. Removing this portion of metal layer 12 opens metal layer 12 between contact pads 13 and 14, thereby "activating" portion $R_1$ of resistive layer 11 such that the resistance between contact pads 13 and 18 now equals that of portion $R_1$ of resistive layer 11.

The resistance of element 10 may be adjusted to any one of numerous possibilities depending upon which of portions $R_1$-$R_5$ are activated. However, since each of the possible resistance values of element 10 is achieved by a distinct cut pattern, separate masks are required to realize all of the possible cut patterns. That is, where it is desirable for structure 1 to have a resistance of, for example, $R_1$+$R_2$, metal layer 17 must be masked and then etched along cut paths 19 and 20, respectively. The masking pattern used in obtaining such a resistance value will necessarily differ from that used in obtaining a resistance of, for instance, $R_1$, and so on. Thus, where it is desired to etch structure 1 differently from run to run, or even between wafers of a common run, numerous cut masks are required. The fabrication and use of multiple cut masks results in an undesirable wasting of time and expense. Further, as the number of links, i.e., portions $R_n$, increases, the waste in time and expense becomes more significant.

SUMMARY

A trimming technique is disclosed which overcomes problems in the prior art mentioned above. In accordance with the present invention, each die containing a resistive element which is to be trimmed has associated therewith a plurality of alignment targets. A cut mask having a trim pattern and an alignment key formed thereon is employed in a masking and etching step to trim the resistive element to a desired resistance. The number of links cut in the resistive element, and thus the final resistance thereof, depends on the particular positioning of the cut mask with respect to the die as determined by which of the alignment targets is used in aligning the cut mask with the die. For instance, aligning the alignment key with a first alignment target may result in cutting one link in the resistive element so as to achieve a first resistance value, while aligning the alignment key with another of the alignment targets may result in cutting two links in the resistive element so as to achieve a second resistance value.

Such a cut mask, by allowing the trim of resistive elements to be adjusted to any one of many possible resistance values by simply changing the alignment of the cut mask with respect to the die, eliminates the need to have a separate cut mask for each of the possible trimmed resistance values. Accordingly, the present invention, by reducing the number of cut masks required to realize a given number of possible resistance values, results in a savings of time and expense.

DETAILED DESCRIPTION

Figure 1:
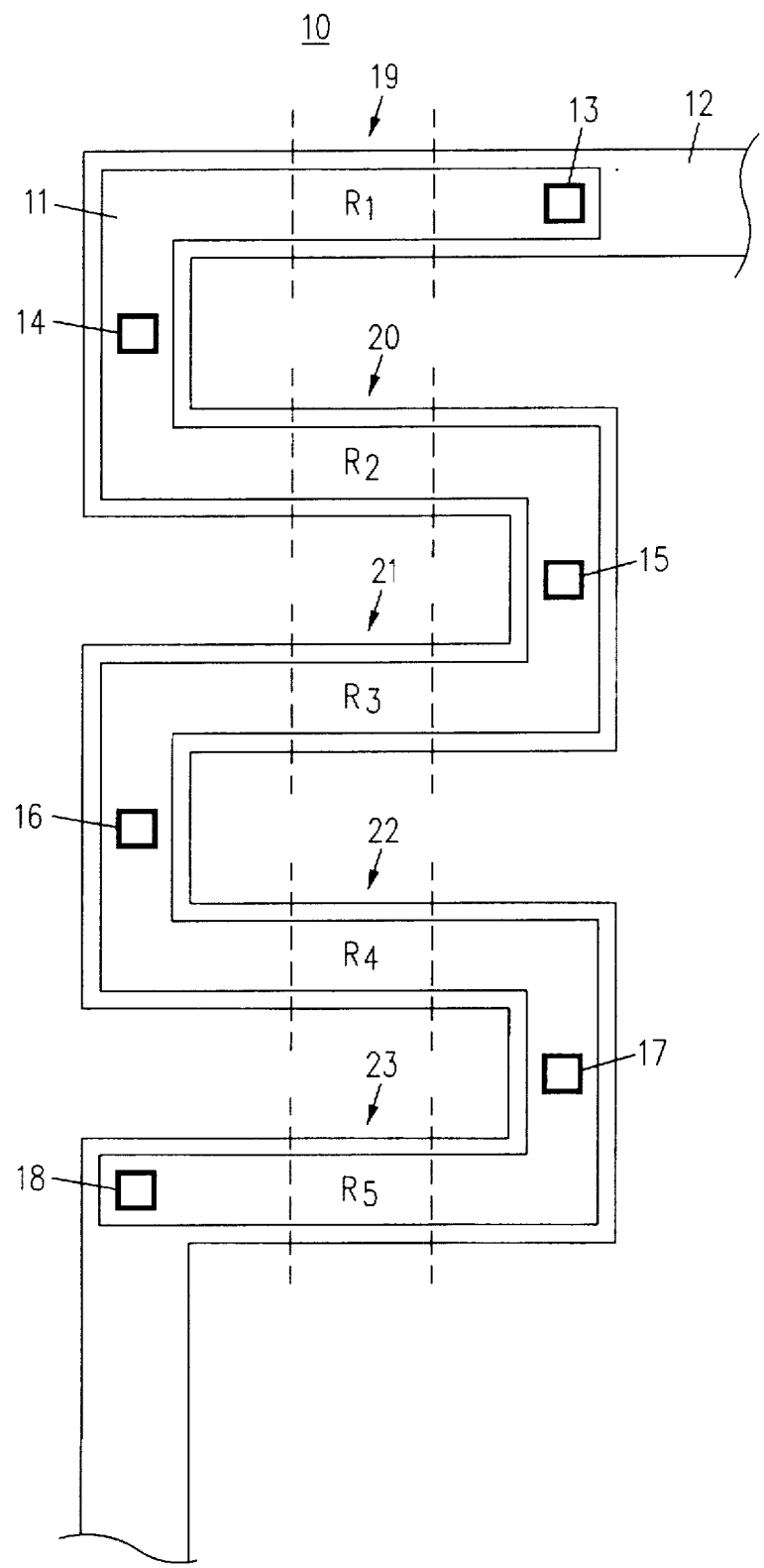
FIG. 1 is a top view of a conventional on-chip resistor element.
Figure 2:
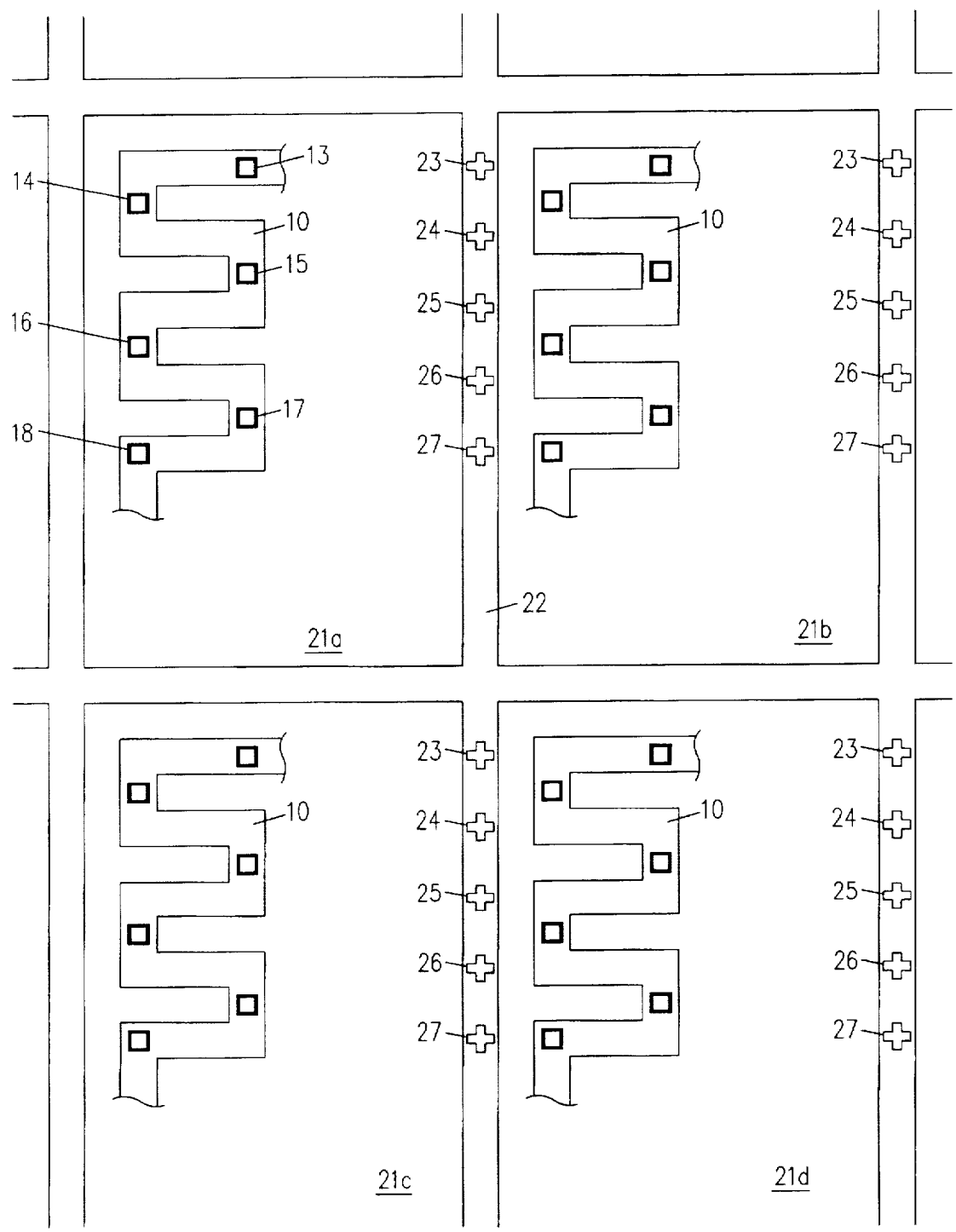
FIG. 2 is a top view of a portion of a wafer containing dice which are to be trimmed in accordance with the present invention.

Embodiments in accordance with the present invention will be discussed below with reference to FIGS. 2 and 3. FIG. 2 shows a portion of a wafer 20 having individual dice 21a–21d separated by scribe channels 22. Each of dice 21a–21d is shown to include in a portion thereof conventional resistor element 11 of FIG. 1. It is to be noted that the particular circuitry or structure formed on the remaining portions of dice 21a–21d are not relevant to the present invention and, thus, are not shown for simplicity. Further, it is to be noted that the particular circuits formed on each of dice 21a–21d may or may not be identical to one another.

Alignment targets 23–27 are formed in portions of scribe channels 22 proximate to each of an associated one of dice 21a–21d, as indicated in FIG. 2. It is to be understood that each of alignment targets 23–27 is representative of a pair of alignment targets, and that the targetsd of each respective pair are preferably spaced a sufficient distance from one another in order to ensure proper alignment of wafer 20 and a cut mask to be described shortly. Further, although each die 21a–21d is shown to have associated therewith five alignment targets 23–27, in other embodiments each die 21a–21d may have a greater or fewer number of alignment targets associated therewith, depending upon the number of portions $R_n$ contained therein and, thus, upon the number possible resistance values element 11 is desired to realize.

Figure 3:
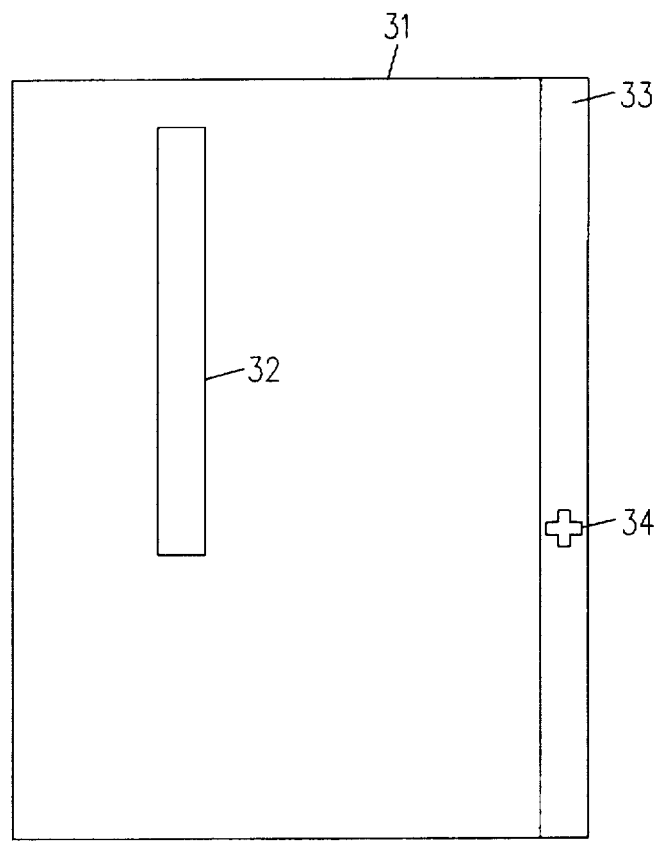
FIG. 3 is a mask having multiple cut patterns in accordance with the present invention.

FIG. 3 shows a cut mask 30 in accordance with the present invention. Cut mask 30 consists of a conventional, transparent quartz substrate 31 having a chrome layer formed thereon which has been selectively etched away to form a generally rectangular mask pattern 32. Cut mask 30 also contains a scribe line 33 having formed therein an alignment key 34. Although only one alignment key 34 is shown for simplicity, it is to be understood that cut mask 30 cut may contain more than one alignment key 34. In the preferred embodiment, the chrome layer is selectively etched to form mask pattern 32 using a scanning electron beam. Although chrome is used in the preferred embodiment, other layers which are substantially opaque to the intended radiation wavelength (e.g., UV) may also be used.

As a first step, wafer 20 has a layer of photoresist spun on and is inserted into a conventional exposure system, such as a Perkin-Elmer projection aligner. Mask 30 is positioned in the exposure system such that alignment key 34 of mask 30 aligns with one of alignment targets 23–27 formed on wafer 20, thereby aligning mask 30 with a selected one of dice 21a–21d.

UV radiation is then passed through mask 30 to expose the selected one of dice 21a–21d with the pattern 32 shown in FIG. 3. The photoresist layer on the resulting wafer is then developed to remove portions of the resist not exposed to the UV radiation, assuming a negative photoresist, thereby exposing underlying portions of metal layer 12 for removal during a subsequent conventional etching step.

The desired resistance of element 11 of each die is determined by the number of cuts etched in metal layer 12 during the above-mentioned etching step. The particular number of cuts etched, and thus the desired resistance of element 10, are dependent upon and may be controlled by the particular alignment of mask 30 with respect to the selected one of dice 21a–21d, as determined by which one of alignment targets 23–27 on wafer 20 is aligned with alignment key 34 of mask 30.

Figure 4B:
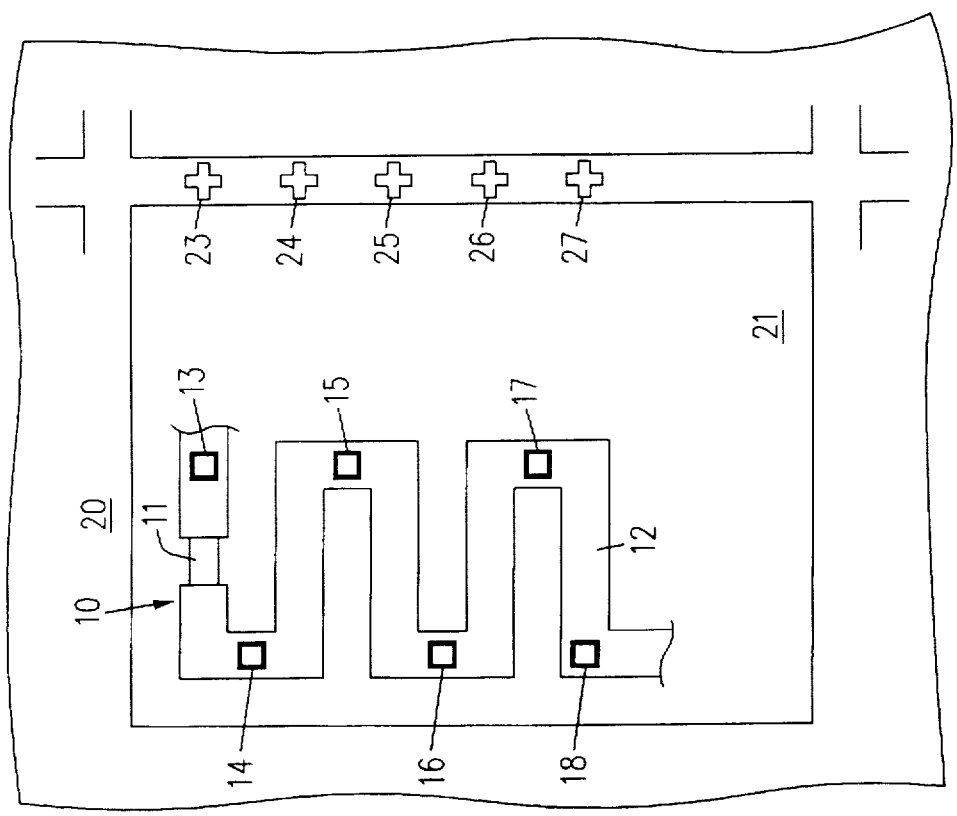
FIGS. 4a and 4b are top views of dice containing resistive elements which have been trimmed in accordance with the present invention.
Figure 4A:
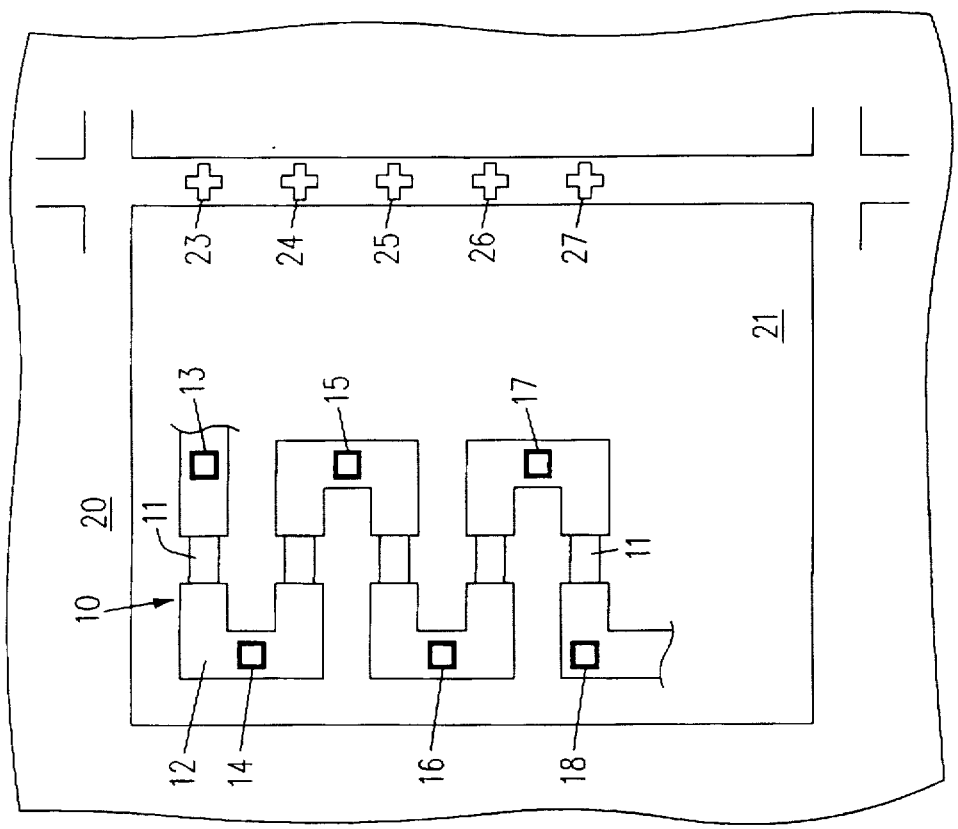

For instance, where it is desired to have the resistance of element 10 of a selected one of dice 21a–21d equal to that of the entire length of resistive layer 11, i.e., equal to $R_1+R_2+R_3+R_4+R_5$ (see FIG. 1), cut mask 30 should be positioned with respect to a selected one of dice 21a–21d such that alignment key 34 of mask cut 30 (FIG. 3) aligns with alignment target 27 of the selected one of dice 21a–21d (FIG. 2). Such an alignment results in pattern 32 overlying each of portions of metal layer 12, interposed between contact pads 13–18, respectively, such that during subsequent masking and etching steps, those portions of metal layer 12 corresponding to cut paths 19–23 will be etched and removed (see also FIG. 1). The resultant structure is shown in FIG. 4a, where element 10 will have a resistance equal to the resistance of resistive layer 11 as measured between contact pads 13 and 18, e.g., $R_1+R_2+R_3+R_4+R_5$.

If it is desired to set the resistance of element 10 to some other value, the alignment of cut mask 30 is simply changed by aligning alignment key 34 of cut mask 30 to another of alignment targets 23–27 of a selected one of dice 21a–21d. For instance, positioning cut mask 30 with respect to the selected die 21a–21d such that alignment key 34 of cut mask 30 aligns with alignment target 23 of die 21a–21d results in the etching of metal layer 12 along only cut path 19 (see also FIG. 1). The resultant structure of element 10, as shown in FIG. 4b, will have a resistance equal to that of portion $R_1$ of resistive layer 11, as measured between contact pads 13 and 18.

Cut mask 30 may thus be used to trim resistive element 10 according to any one of many possible combinations of cut paths simply by manipulating the alignment of mask 30 with respect to wafer 20. Accordingly, unlike conventional trimming techniques which require a different cut mask for each of the possible cut paths and thus for each of the possible resistance values of element 10, a single cut mask 30 may be used to trim element 10 to one of many possible resistance values depending upon the particular alignment between cut mask 30 and wafer 20. In such a manner, the present invention eliminates the need to fabricate a separate cut mask for each of the possible trimmed resistance values of element 10, thereby reducing fabrication costs. Further, since changing the resistance value of element 10 from one wafer to another wafer does not require inserting a new mask, but rather involves only re-aligning mask 30, the present invention may also result in a savings of time.

It should be noted that in certain alignments a part of cut mask 30 may overlie a portion of the adjacent wafer. For instance, where cut mask 30 is aligned to die 21c (FIG. 2) such that alignment key 34 aligns with alignment target 23, part of cut mask 30, including part of pattern 32, will overlap adjacent die 21a. Thus, it is necessary that the portion of die 21a (as well as every other die on a wafer) which is subject to such overlapping be free of metal in order to prevent an inadvertent etching of metal on die 21a during trimming of die 21c.

An additional advantage of the present invention stems from the "blind" nature of metal-link trimming. It is said that metal-link trimming is blind since, because element 10 is initially shorted between contact pads 13 and 18 by metal layer 12, it is impossible to determine the exact resistance values of those portions ($R_1$–$R_5$) of resistive layer 11 interposed between respective pairs of contact pads 13–18 before etching respective portions of metal layer 12. Thus, the exact resistance of portions $R_n$ of element 10 may be ascertained only after metal layer 12 has been etched. Due to processing variations inherent in the fabrication of an integrated circuit, the actual resistances of portions $R_1$–$R_5$ may vary from their intended values. Thus, several iterations, e.g., several trims of element 10, may be required to achieve the desired resistance value. In such a case, cut mask 30 need only be re-aligned with the selected one of dice 21a–21d during such iterations, as compared to conventional trimming techniques which would require additional cut masks to effect such iterations.

In a similar manner, a single cut mask 30 may be used in the fabrication of products having different operating characteristics. For instance, where it is desired to construct 5V and 3.3V voltage regulators, the same cut mask 30 may be readily employed in trimming both regulators by simply changing the alignment of cut mask 30. Conventional trimming techniques would, on the other hand, require a separate mask for each of the regulators.

As indicated earlier, cut mask 30 may be used to trim resistive elements having more than five portions $R_1$–$R_5$. In some cases the number of portions $R_n$ of a resistive elements may be so numerous, and thus the resistive element so long so as to render cut mask 30 physically incapable of masking the entirety of the resistive element. In such a case, cut mask 30 may be used more than once, using different sets of alignment targets, in the trimming of such a single resistive element. Note that as the number of portions $R_n$ of a resistive element is increased, thereby increasing the number of possible cut patterns, the time and cost savings realized by the present invention become more significant.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. Specifically, while the present invention has been described above in the context of trimming on-chip resistive elements, the present invention may be employed in masking steps in the fabrication of other components such as, for instance, in configuring programmable logic arrays (PLAs).

What is claimed is:

1. A method for forming a resistor comprising:

forming a layer of resistive material over a substrate in a serpentine pattern, said resistive material having a first terminal and a second terminal;

forming a layer of highly conductive material overlying and insulated from said resistive material, said conductive material being in a serpentine pattern conforming to said resistive material;

forming a plurality of alignment targets overlying said substrate;

forming a plurality of spaced contact points extending between said conductive material and said resistive material to electrically connect together said conductive material and said resistive material at said contact points;

forming a masking layer over said conductive material;

providing a mask having formed thereon a mask pattern and an alignment key;

aligning said mask with said substrate by aligning said alignment key to a selected one of said alignment targets so as to selectively expose portions of said masking layer to radiation through said mask pattern, said mask pattern being such that a resistance value between said first terminal and said second terminal of said resistive material is selectable based upon to which of said alignment targets said alignment key is aligned;

removing portions of said masking layer defined by said mask pattern to expose one or more portions of said conductive material, each of said portions being located between an associated pair of said contact points; and removing said one or more portions of said conductive material, wherein removing said one or more portions determines said resistance value between said first terminal and said second terminal of said resistive material.

2. The method of claim 1 wherein said masking pattern is substantially a rectangular shape.

3. The method of claim 1 wherein said masking layer comprises a negative photoresist.

4. The method of claim 1 wherein said highly conductive material is a metal.

5. The method of claim 1 wherein said substrate contains a plurality of dies, each containing said resistor formed thereon.

6. The method of claim 1 wherein said steps of aligning said mask, removing portions of said masking layer, and removing said one or more portions of said conductive material are conducted in two or more iterations after aligning said alignment key to a different one of said alignment targets to achieve a desired resistance value between said first terminal and said second terminal.

7. The method of claim 1 wherein said serpentine pattern of said resistive material and said conductive material contains a central section between pairs of said contact points, wherein portions of said conductive material which may be removed are located in each said central section.

* * * * *